United States Patent [19]

Wiesner

[11] 3,748,726

[45] July 31, 1973

[54] METHOD FOR MOUNTING SEMICONDUCTOR COMPONENTS

[75] Inventor: Richard Wiesner, Neukeferloh, Germany

[73] Assignee: Siemens Aktiengesellschaft, Munich, Erlangen and Berlin, Germany

[22] Filed: Sept. 18, 1970

[21] Appl. No.: 73,303

[30] Foreign Application Priority Data

Sept. 24, 1969 Germany .................. P 19 48 333.1

[52] U.S. Cl. ........................ 29/580, 29/589, 29/588

[51] Int. Cl. ............................................ B01j 17/00

[58] Field of Search ..................... 29/589, 627, 590, 29/500, 470.9, 580, 588; 156/3

[56] References Cited

UNITED STATES PATENTS

| | | | |
|---|---|---|---|
| 3,325,882 | 6/1967 | Chiou et al. | 29/589 |
| 3,480,836 | 11/1969 | Aronstein | 29/627 X |
| 3,484,534 | 12/1969 | Kilby et al. | 156/3 X |
| 3,098,951 | 7/1963 | Ayer et al. | 29/625 X |

*Primary Examiner*—Charles W. Lanham
*Assistant Examiner*—Wilbur C. Tupman
*Attorney*—Curt M. Avery, Arthur E. Wilfond, Herbert L. Lerner and Daniel J. Tick

[57] ABSTRACT

A method for connecting an integrated circuit with outside electric leads where the integrated circuit is inserted into an insulating substrate with thereon-situated electrical conductor paths and an electrical connection is produced between the conductor paths on the substrate and the integrated circuit. The method of the invention is to bore a hole into the substrate constituting a non-etchable insulating material. The hole is filled in with an etchable material. Conductor paths are placed upon said substrate, so that the conductor paths project beyond the edge of the hole, filled with the etchable material. The etchable material is then etched from the hole, the integrated circuit inserted into said hole and the ends of the conductor paths which project above the edge of the hole, are electrically connected with the integrated circuit.

4 Claims, 3 Drawing Figures

METHOD FOR MOUNTING SEMICONDUCTOR COMPONENTS

The present invention relates to a method for connecting an integrated circuit with outside electric leads; installing the integrated circuit into an insulated substrate with electrical conductor paths situated thereupon, and effecting the electrical connection between the conductor paths on the substrate and the integrated circuit.

According to known methods, integrated circuits are produced on a substrate and the conductor paths are etched free away on the circuit itself. The periodical THE WESTERN ELECTRIC ENGINEER, December 1967, describes on pages 16 to 26, the connection using the "beam lead technique" of an integrated circuit, with an outer lead. According to this method, the conductor paths are affixed at the integrated circuit proper, for example by vapor deposition and the electrical connection with the outside leads is effected via the conductor paths, outside the integrated circuit. This requires that the conductor paths are etched free on the integrated circuit so as to freely project beyond the edge of the substrate of the integrated circuit. This method of etching requires great exactness and thus is difficult to effectuate. The conductor paths also need space on the integrated circuit if they are, first, to be affixed thereto. This is specifically contrary to the actual aim for integrated circuits, i.e. to accommodate on the smallest possible space, as many components as possible. Integrated circuits with protruding conductor paths are also hard to manipulate, since they are easily damaged, mechanically.

Further methods have become known where the connection between the integrated circuit and its outer leads is produced via thin wires. To this end, each wire must be affixed individually, at both the lead and at the integrated circuit, which necessitates a great number of method steps. The connection via contact wires is therefore expensive and difficult to carry out.

Finally, it had been suggested to place conductor paths upon an etchable substrate, to etch a hole into said substrate and to instal the semiconductor component, thereinto. It was found, however, that the use of etchable substrates frequently causes technological difficulties.

It is the object of the invention to provide a method which permits the use of non-etchable substrates, as well.

To this end, the present invention provides a substrate of non-etchable insulating material; to bore a hole therein, fill said hole with an etchable material; place conductor paths upon said substrate in a way that they protrude above the rim of the hole filled with etchable material; etch the material out of said hole; place the integrated circuit into said hole and connect electrically the ends of said conductor paths projecting over said hole with the integrated circuit.

As a further preferred feature, the invention can use arbitrary substrates, thus eliminating difficult etching processes. The dimensioning of the hole whereinto the integrated circuit is being inserted, may be easily established by a boring process. Moreover, the space required for the conductor paths is slight since the contacts between the integrated circuit and the conductor paths, serve only the electrical connection and not for fastening the freely projecting conductor paths.

Other features and details of the present invention will be derived from the following description of a specific embodiment, with reference to the drawing, wherein.

Figure 1:
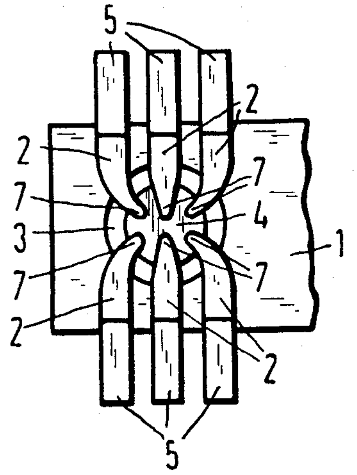
FIG. 1 is a top view upon a non etchable substrate with an installed integrated circuit, where a heat conducting electrical insulator has been omitted.

A hole 3 is bored into an insulated, non-etchable substrate 1. The hole 3 is then filled in with an etchable material. The surface of the substrate 1 and of the etchable material is provided with conductor paths 2, by vapor deposition or galvanic deposition. The outer ends of the conductor paths 2 which, for example, may consist of gold, are attached to contacts 5, by soldering, welding or thermo-compression. The etchable material is then etched out of the hole 3 and the integrated circuit 4, inserted into said hole.

According to another preferred feature of the invention, an oxide ceramic may be used as the non-etchable substrate.

Figure 2:
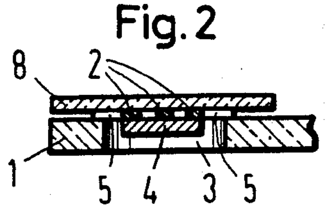
FIG. 2 is a cross-section through the object of FIG. 1, where the heat conducting electrical insulator is shown, in a first embodiment.
Figure 3:
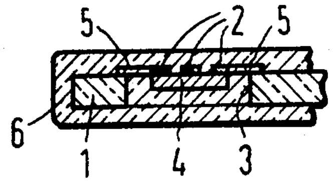
FIG. 3 is a cross-section through the object of FIG. 1, where the heat conducting electrical insulator is illustrated in a second embodiment.

It is expedient to cast the entire device with a heat conducting electrical insulator or to paste the same thereon. Thus, it is possible, for example, to cast the hole 3 with the circuit 4 installed therein, with a material 6 having good thermal conductivity (FIG. 3). According to a preferred embodiment, it is also possible to paste a plate 8 upon the surface of the entire device. This plate 8 will conduct heat but will provide electrical insulation (FIG. 2). This feature provides a good heat transfer of the dissipated heat which occurs in the integrated circuit. It is recommended to use the same material for the conductor paths 2 as for the contact points 7, of the integrated circuit. This makes it possible to connect in a simple way, the integrated circuit with the conductor paths. In addition, this prevents the occurrence of thermal stresses.

I claim:

1. A method for connecting an integrated circuit with outside electric leads where the integrated circuit is inserted into an insulating substrate with thereon situated electrical conductor paths and an electrical connection is produced between the conductor paths on the substrate and the integrated circuit; which comprises boring a hole in a substrate consisting of a non-etchable insulating material, filling said hole in with an etchable material, placing conductor paths upon said substrate so that an end of each of said conductor paths projects beyond the edge of the hole filled with said etchable material, etching away said etchable material from the hole whereby the projecting ends of the conductor paths protrude freely in an unsupported manner beyond the edge of the hole, inserting an integrated circuit into said hole and electrically connecting ends of the conductor paths which project beyond the edge of the hole with the integrated circuit.

2. The method of claim 1, wherein oxide ceramic is used as the non-etchable insulating substrate.

3. The method of claim 1, wherein the insulating substrate with the installed circuit that is connected with the conductor paths projecting beyond the edge of the hole, is enclosed by a heat conducting insulator.

4. The method of claim 1, wherein an electrically insulating plate which provides good thermal conductivity is pasted upon the substrate containing the conductor paths.

* * * * *